(12) United States Patent
Krahn et al.

(10) Patent No.: US 11,874,241 B2
(45) Date of Patent: Jan. 16, 2024

(54) INTERCHANGEABLE SAMPLE CELL FOR DNP-NMR MEASUREMENTS HAVING A FLAT SAMPLE CAVITY

(71) Applicant: Bruker BioSpin GmbH, Ettlingen (DE)

(72) Inventors: Alexander Krahn, Karlsruhe (DE); Franck Vincent, Remoray (FR)

(*) Notice: Subject to any disclaimer, the term of this patent is extended or adjusted under 35 U.S.C. 154(b) by 0 days.

(21) Appl. No.: 17/847,348

(22) Filed: Jun. 23, 2022

(65) Prior Publication Data
US 2023/0014131 A1    Jan. 19, 2023

(30) Foreign Application Priority Data
Jul. 6, 2021   (EP) .................................... 21184072

(51) Int. Cl.
*G01N 24/08*   (2006.01)
*G01N 24/10*   (2006.01)
*G01R 33/34*   (2006.01)

(52) U.S. Cl.
CPC ............. *G01N 24/08* (2013.01); *G01N 24/10* (2013.01); *G01R 33/34092* (2013.01)

(58) Field of Classification Search
CPC .. G01N 24/08; G01N 24/10; G01R 33/34092; G01R 33/30; G01R 33/31; G01R 33/62
See application file for complete search history.

(56) References Cited

U.S. PATENT DOCUMENTS

| 8,570,033 B2 | 10/2013 | Prisner et al. |
| 2008/0100296 A1* | 5/2008 | Massin ................ G01R 33/302 324/321 |
| 2016/0334476 A1 | 11/2016 | Doty |

OTHER PUBLICATIONS

Garcia, S. et al., "L-band Overhauser dynamic nuclear polarization" Journal of Magnetic Resonance 203 (2010), pp. 138-143.
"MiniScope MS 5000 ESR spectormeter with scientific grade performance", Magnettech GmbH, Berlin, Germany [retrieved Jun. 10, 2021].
Wilmad Labglass, Aqueous Flat Cells (https://www.wilmad-labglass.com/ProductList.aspx?t=206), retreived on Apr. 16, 2021.
Wildmad Labglass, "EPR Consumables and Accessories", 2011.
(Continued)

*Primary Examiner* — Jay Patidar
(74) *Attorney, Agent, or Firm* — Benoît & Côté Inc.

(57) ABSTRACT

The invention relates to a sample cell for performing DNP-NMR measurements, for interchangeable use in an EPR microwave resonator, with the sample cell comprising
a flat sample cavity for holding a liquid sample to be measured, wherein the flat sample cavity extends with a maximum length L and a maximum width W in a sample cavity plane, and extends with a maximum height H perpendicular to the sample cavity plane, with $H \leq \frac{1}{15} * L$ and $H \leq \frac{1}{15} * W$, and
an NMR coil wound around the flat sample cavity for generating an RF magnetic field $B_2$, wherein a coil axis of the NMR coil about which the NMR coil is wound is oriented perpendicular to the sample cavity plane. The invention provides a sample cell which is easy to handle and improves the quality and the reproducibility of DNP-NMR measurements.

19 Claims, 7 Drawing Sheets

(56) References Cited

OTHER PUBLICATIONS

Kiss, S.Z., et al., "Microfluidic Overhauser DNP chip for signal-enhanced compact NMR", Scientific Reports 11:4671, 2021.
Massin, C., et al., "Planar microcoil-based microfluidic NMR probes", Journal of Magnetic Resonance 164 (2003), pp. 242-255.
Prisner, T., et al., "Liquid state DNP at high magnetic fields: Instrumentation, experimental results and atomistic modelling by molecular dynamics simulations", Journal of Magnetic Resonance 264 (2016), pp. 68-77.
Spengler, N., et al., "Micro-fabricated Helmholtz coil featuring disposable microfluidic sample inserts for applications in nuclear magnetic resonance", Journal of Micromechanics and Microengineering 24-034004 (2014).
Syms, R. R. A., et al., "MEMS Helmholtz coils for magnetic resonance imaging", Journal of Micromechanics and Microengineering 15 S1-S9 (2005).

* cited by examiner

INTERCHANGEABLE SAMPLE CELL FOR DNP-NMR MEASUREMENTS HAVING A FLAT SAMPLE CAVITY

BACKGROUND OF THE INVENTION

Field of the Invention

The invention relates to a sample cell for performing DNP-NMR measurements, for interchangeable use in an EPR microwave resonator.

Description of the Related Art

Nuclear magnetic resonance (NMR) spectroscopy is a widely used and very important method in material science, chemistry and biology. Scientists use NMR spectroscopy to determine the structure and/or the dynamics of an examined sample or compound. However, one major problem of NMR spectroscopy is that NMR spectroscopy generally suffers from low sensitivity. The low sensitivity and the accompanying small signal intensities can for example be overcome by signal averaging to obtain a sufficiently high signal-to-noise ratio. However, signal averaging can be a time-consuming and cost-intensive process.

Dynamic nuclear polarization (DNP) offers the possibility to enhance the NMR signal by orders of magnitude. In DNP the spin polarization from paramagnetic electrons is transferred to nuclei of the sample to be measured. The nuclear spins are aligned proportional to the extent that the electron spins are aligned, wherein the electron spin polarization is enhanced using microwave radiation. Accordingly, more nuclear spins in the sample become aligned as compared to the level that would result from the Boltzmann distribution in thermal equilibrium, so hyperpolarization of the sample is achieved. Due to the larger number of aligned nuclear spins the NMR signals are enhanced.

DNP-NMR measurements are mainly carried out on solid-state samples, but it is also possible to carry out DNP-NMR measurements on liquid samples. For a DNP-NMR measurement of a liquid sample the liquid sample is typically filled in a sample tube. The sample to be measured is placed in an electron paramagnetic resonance (EPR) resonator. The sample is then irradiated with a microwave (MW) magnetic field (near or at the EPR) $B_1$ of appropriate direction and amplitude, wherein the sample is in an appropriate static background magnetic field $B_0$, to saturate the electron spin transition. At the same time, the nuclear spins are excited by an additional radio frequency (RF) magnetic field $B_2$ and the corresponding RF answer of the sample or its nuclear spins is measured.

During the measurement MW electrical energy is absorbed by the sample. In case of a liquid sample the absorption of the electrical energy leads to unwanted sample heating. This complicates obtaining quantitative and reproducible results and can lead to destruction of the sample. Additionally, the liquid sample in a classical sample tube can only be excited inhomogeneously since it extends over the homogeneous range of the magnetic MW field.

Garcia et al., "L-band Overhauser dynamic nuclear polarization", Journal of Magnetic Resonance, 203 (2010), 138-143 disclose a DNP instrument at 0.04 T using 1.1 GHz electron spin resonance (ESR) frequencies and 1.7 MHz $^1$H NMR frequencies. The DNP probe comprises a loop-gap resonator and the NMR and EPR circuits are housed in the same probe head. The NMR coil is wrapped around the EPR resonator. A sample cell, in this case a doty susceptibility plug, with up to 5 mm diameter is placed inside the overlapping region of the loop gap resonator and the NMR coil. The electron-nucleus coupling factor of a liquid sample has been determined.

In Garcia, the coupling of the MW electric field has not been investigated, so the problem of heating the liquid sample remains unresolved. Also the efficiency of the NMR coil wrapped around the EPR resonator and thereby the efficiency of the NMR measurements is low because the NMR coil is located far away from the sample outside of the EPR resonator.

DE 10 2008 017 135 A1 describes a dual resonance structure for DNP-NMR experiments. The dual resonance structure comprises a MW resonator for generating electromagnetic fields suitable for EPR and an RF resonator, namely a strip resonator, for generating electromagnetic fields suitable for NMR. One part of the strip resonator also forms a part of the MW resonator. In the area where the strip resonator also forms a part of the MW resonator a ring is placed directly onto the strip resonator. The ring is used to hold a liquid sample to be measured.

When using such a setup the ring has to be cleaned after each measurement to ensure that no residues of former measurements disturb the new measurements. Furthermore, depending on the solvent used for the measurement it may also happen that the solvent evaporates before the measurement has finished. Further, the filling factor of the RF resonator is small.

US 2016/0334476 A1 depicts a tuneable static DNP probe comprising a coilform with a sample cavity. A NMR coil for performing NMR measurements is wrapped around the coilform.

With such a setup it is possible to measure liquid samples. However, the problem of sample heating of liquid samples has not been discussed here and again the efficiency of the NMR measurements is low because the NMR coil is located far away from the sample.

There are sample cells for EPR measurements that are commercially available. Flat type EPR sample cells are for example shown on the webpage of the company SP Wilmad-LabGlass, Vineland (New Jersey, USA), compare https://www.wilmad-labglass.com/ProductList.aspx?t=206 of 16.04.2021.

An ESR spectrometer with a TE102 type resonator is described in the commercial publication "MiniScope MS 5000 ESR spectrometer with scientific grade performance" of magnettech GmbH, Berlin, DE.

In summary, there are different attempts to improve DNP-NMR measurements. However, the problem of sample heating or inhomogeneous excitation of the sample often remains. The use of different DNP-NMR setups with different types of sample cells for different research groups renders a comparison of their results difficult. Moreover, the known DNP-NMR setups are often constructed such that the placement of the NMR coils is not ideal for the NMR measurements.

SUMMARY OF THE INVENTION the present invention provides a sample cell which is easy to handle and improves the quality and the reproducibility of DNP-NMR measurements. This object is achieved, in accordance with the invention, by a sample cell for performing DNP-NMR measurements, for interchangeable use in an EPR microwave resonator, with the sample cell comprising:
a flat sample cavity for holding a liquid sample to be measured, wherein the flat sample cavity extends with a maximum length L and a maximum width W in a sample cavity plane, and extends with a maximum height H perpendicular to the sample cavity plane, with H≤1/15*L and H≤1/15*W, and an NMR coil wound around the flat sample cavity for generating an RF magnetic field $B_2$, wherein a coil axis of the NMR coil about which the NMR coil is wound is oriented perpendicular to the sample cavity plane.

As an overview, the present invention proposes a sample cell with a flat sample cavity and an NMR coil wound around the flat sample cavity, which is directly arranged at the sample cell, which is designed to be exchanged (together with the sample) at an EPR microwave resonator.

The sample cell is designed in such a way that the q factor of the EPR microwave resonator is affected as little as possible, i.e., may remain high with the sample cell inserted. The q factor (also called quality factor) is a dimensionless parameter that describes the dampening of a resonator; the lower the dampening, the higher is the q factor. The measurement quality for DNP-NMR measurements can be improved when the q factor is large.

Furthermore, the sample cell is dimensioned such that, when the sample cell is positioned inside an EPR microwave resonator during a DNP-NMR measurement, the liquid sample filled into the sample cell may be located practically completely in a region of low MW electric field; this is achieved by a flat sample cavity, which can be arranged in a basically plane shaped maximum of the MW magnetic field, which corresponds to a basically plane shaped minimum of the MW electric field. In this way the MW magnetic field irradiates the liquid sample and saturates the electron spin transition while the absorption of MW electrical energy by the liquid sample is minimized. Thereby, the quality of the DNP-NMR measurements can be improved, the dielectric losses as well as the heating of the liquid sample can be minimized and the measurements can be performed at stable temperatures. Also sample decomposition due to increased temperatures of the liquid sample can be prevented and the reproducibility of the measurements can be improved.

Further, by arranging the NMR coil on the interchangeable sample cell, the NMR coil can be located very close to the flat sample cavity and in this way the sample, and the inner region of the NMR coil can be filled to a large extent with the liquid sample. This results in a high NMR signal intensity.

The sample cell can be easily exchanged at an ESR resonator and is inexpensive to produce, so that it can be used as a consumable, if desired. Thereby, cross-contaminations between samples do not occur. The sample cell is suitable for mass production and widespread use throughout different laboratories, what helps to increase comparability of measurement results.

In more detail, the flat sample cavity has typically a circular or an ellipsoidal or a rectangular cross-section (in the sample cavity plane) and a very small thickness (perpendicular to the sample cavity plane). The q factor depends, among other things, on the thickness of the flat sample cavity. A flat sample cavity with a small thickness can be aligned easier with the maximum of the MW magnetic field and the minimum of the MW electric field inside an EPR microwave resonator. By choosing a small thickness of the flat sample cavity the q factor reaches a larger value and heating of the liquid sample can be minimized.

Preferably, the cross-section of the flat sample cavity in the sample cavity plane is shaped substantially quadratically or substantially rectangularly, and the flat sample cavity is formed substantially cuboidally. With a flat sample cavity formed in such a manner comparably large sample volumes can be arranged in a homogenous region of the $B_1$ field of an EPR resonator, and in a region of low MV electric field strength of the EPR resonator.

A typical maximum height H of the flat sample cavity is H≤0.5 mm or even H≤0.3 mm. Also typically, H≤1/20*L and H≤1/20*W. The transverse dimensions, i.e., the maximum length L and the maximum width W, are typically given by the available space inside the EPR microwave resonator (also called EPR cavity). The longitudinal dimension (thickness, maximum height H) is determined (limited) by the EPR wavelength (microwave wavelength) λ, typically with H≤λ/10.

During measurement, the sample cell is oriented with its sample cavity plane (also called transverse plane, in which L and W extend) along a plane of minimum electric field of the applied microwave mode. In this way the heating of the liquid sample caused by the MW electrical energy can be minimized. The sample cavity plane is centrally arranged inside the flat sample cavity with respect to the direction perpendicular to the sample cavity plane.

The sample cell preferably is basically plate shaped, wherein the sample cell extends with a maximum length LS and a maximum width WS in the sample cavity plane, wherein LS≥WS, preferably LS≥4*WS, wherein the sample cell extends with a maximum height HS perpendicular to the sample cavity plane, wherein HS<LS and HS<WS, in particular HS<1/10*LS and HS<1/10*WS, and wherein for the height HS of the sample cell, the following applies: HS≤2.5 mm, preferably HS≤1.5 mm, most preferably HS≤1.0 mm. Such sample cells can be easily manufactured and the dimensions can be suitable to provide enough stability to the sample cell with the flat sample cavity. Further, such sample cells are easy to handle and can simply be inserted into an EPR microwave resonator.

Preferably, the sample cell comprises two channels for filling the liquid sample into the flat sample cavity or to remove the liquid sample from the flat sample cavity, in particular wherein the channels are positioned next to each other. In this way the liquid sample can be easily filled into or removed from the sample cell. Additionally, only a fraction of the flat sample cavity is exposed to the environment which can reduce the entry of impurities and lower the evaporation of the solvent of the liquid sample.

The (internal) NMR coil wound around the flat sample cavity generates an additional RF magnetic field $B_2$. The NMR coil allows simultaneous excitation and measurement of the nuclear spins of the sample to be measured. The shape and the orientation of the NMR coil are chosen such that the interference with the MW field is minimized. Furthermore, the best q factors are received when the plane of the NMR coil and the sample cavity plane are as close together as possible.

Typically, at least 70%, preferably at least 80%, most preferably at least 90% of an inner area confined by the NMR coil is taken up by a cross-section of the flat sample cavity in the sample cavity plane. Due to the high filling factor of the NMR coil the signal strength of the NMR signal can be amplified. Preferably, the NMR coil comprises two conductor loops. Typically, the two loops are wound in a pancake type fashion. In other embodiments, the NMR coil may comprise even more than two conductor loops.

An exemplary embodiment of the inventive sample cell is characterized in that the sample cell comprises a first plate and a second plate, that the flat sample cavity is formed by a cavity recess in the first plate and/or a cavity recess in the second plate, and that the first plate and second plate are joined to each other, with the flat sample cavity enclosed between them. This is an easy and cost-effective way to manufacture the sample cell. The cavity recess and thereby the geometry of the flat sample cavity can be freely designed (in particular depending on the planned measurement experiment). The cavity recess can for example be etched by laser-assisted micromachining. Fused silica or borosilicate can be used as a material for the plates (both are suitable for laser-assisted micromachining).

In a particular development of this embodiment, a coil recess is formed in the first plate and/or a coil recess is formed in the second plate, wherein the NMR coil is arranged in the coil recess of the first plate and/or the coil recess of the second plate, in particular wherein the NMR coil is enclosed between the first plate and the second plate. This is an easy and cost-effective way to integrate the NMR coil into the sample cell. The geometry of the coil recess and thereby the geometry of the NMR coil can be adapted to the cavity recess, in particular such that a large filling factor of the NMR coil is achieved. Sputtering can be used to produce the NMR coil. When joining the first plate and the second plate with the NMR coil arranged ("sandwiched") between them the NMR coil is protected inside the two plates and the risk of damaging the NMR coil can be minimized, e.g., if the sample cell is inserted into a holder. Furthermore, the flat sample cavity and the NMR coil can be brought into close proximity which improves the quality of DNP-NMR measurements. The coil recess can for example be etched by laser-assisted micromachining.

In another further development, the flat sample cavity is formed only by a cavity recess of the first plate, and only the second plate forms a coil recess, in which the NMR coil is arranged. In this way the production of the sample cell can be further simplified. The cavity recess only has to be etched into the first plate and the coil recess only has to be etched into the second plate. The two plates can then be joined in an uncomplicated way.

In an advantageous embodiment of the sample cell, for an offset distance $O_d$ between a centre point $P_{NMR}$ of the NMR coil and a centre point $P_{CS}$ of the flat sample cavity, taken along the direction perpendicular of the sample cavity plane, the following applies:

$O_d \leq 0.5$ mm, preferably $O_d \leq 0.35$ mm, more preferably $O_d \leq 0.2$ mm, most preferably $O_d = 0$.

In other words, the NMR coil and the flat sample cavity are in close proximity with respect to the direction perpendicular to the sample cavity plane. The offset distance $O_d$ affects the q factor. The q factor generally reaches its highest value when the offset distance $O_d$ is minimal. Accordingly, with a small $O_d$, a large q factor is achieved, thereby achieving a better quality of the NMR measurements.

Another advantageous embodiment of the sample cell is characterized in that: the maximum length L of the flat sample cavity is 3 mm≤L≤7 mm, preferably 4 mm≤L≤6 mm, most preferably L=5 mm; that the maximum width W of the flat sample cavity is 3 mm≤W≤7 mm, preferably 4 mm≤L≤6 mm, most preferably W=5 mm; and that the maximum height H of the flat sample cavity is 0.12 mm≤H≤0.36 mm, preferably 0.15 mm≤H≤0.25, most preferably H=0.2 mm. These are dimensions that have been proven in practice. The flat sample cavity forms a comparably large sample volume that can be arranged in an EPR microwave resonator. Furthermore, the height H of the sample affects the q factor. Better q factors can in general be achieved when the height H is small.

The scope of the present invention also includes an NMR probe for performing DNP-NMR measurements, for use in an EPR microwave resonator, with the NMR probe comprising:
an inventive sample cell as described above,
a sample cell holder for reversible insertion of the sample cell, wherein the sample cell is inserted into the sample cell holder, and
two sweeping coils for generating a sweeping magnetic field which is substantially parallel to the sample cavity plane in the area of the flat sample cavity of the inserted sample cell.

Such an NMR probe can easily be used with an EPR microwave resonator. The sample cell can simply be inserted and taken out of the sample cell holder for changing the measurement sample; for this purpose it is possible to fill and to empty the sample cell outside the NMR probe conveniently. The sweeping magnetic field, which during measurement is substantially parallel to the static magnetic field $B_0$ in the area of the flat sample cavity, is (basically) perpendicular to the RF magnetic field $B_2$ of the NMR coil in the area of the flat sample cavity. Typically, the two sweeping coils are arranged on both sides of the sample cell.

In an exemplary embodiment of the NMR probe, with the sample cell inserted into the sample cell holder, the NMR probe forms at least one tempering channel for varying and/or keeping a temperature of the liquid sample to be measured, in particular wherein at least in a region of the flat sample cavity, the at least one tempering channel extends parallel to the flat sample cavity and adjacent to the sample cell. This poses a simple way to control the temperature of the liquid sample. When the temperature is kept constant, the quality of the measurements can be improved. In use, a tempering fluid flow (typically a gas flow) is fed through the tempering channel. When there is only one tempering channel, the tempering channel preferably extends on the side of the sample cell closest to the flat sample cavity. Preferably, with the sample cell inserted, there is a tempering channel on both sides of the sample cell. A temperature control system may be used for controlling the temperature of the sample via the tempering fluid flow.

In a particular development of this embodiment, the NMR probe comprises a dielectric sleeve, wherein the dielectric sleeve at least partially limits the at least one tempering channel, in particular wherein an inner region of the dielectric sleeve is subdivided into two tempering channels with the sample cell inserted in the sample cell holder. With the dielectric sleeve, a tempering channel or channels can be formed particularly easily. The dielectric sleeve may be contain or may be made from polyethylene or ceramics. By using two tempering channels the temperature control can be further improved.

An advantageous embodiment of the NMR probe is characterized in that the two sweeping coils are rod-shaped, in particular with a circular cross-section each, that the two sweeping coils are running parallel to each other, and that the two sweeping coils are running parallel to the sample cavity plane. The form and the arrangement of the sweeping coils has been proven in practice.

A maximum outer diameter $d_{out}$ of the sweeping coils affects the q factor. The q factor increases when the outer diameter $d_{out}$ of the sweeping coils decreases in size. Typically, for the maximum outer diameter $d_{out}$ of the rod-shaped sweeping coils applies $d_{out} \leq 2.0$ mm, preferably $d_{out} \leq 1.5$ mm, most preferably $d_{out} \leq 1.0$ mm, and/or $d_{out} \geq 0.3$ mm, preferably $d_{out} \geq 0.4$ mm, most preferably $d_{out} \geq 0.5$ mm. Typically the rod-shaped sweeping coils are of tube type with a coil wire included inside.

The scope of the invention furthermore includes a DNP-NMR measuring device comprising:
- an EPR microwave resonator;
- an NMR probe as described above, wherein the NMR probe is positioned at least partially inside the EPR microwave resonator such that the flat sample cavity and the NMR coil of the sample cell inserted into the sample cell holder are positioned inside the EPR microwave resonator; and
- a magnet arrangement for generating a $B_0$ magnetic field which is parallel to the sweeping magnetic field and parallel to the sample cavity plane in the area of the flat sample cavity of the inserted sample cell.

This is an easy to implement set-up to perform DNP-NMR measurements. It is possible to use existing EPR microwave resonators for the DNP-NMR measuring device easily. The EPR microwave resonator can achieve a high q factor with the inventive NMR probe and the inventive sample cell inserted. The $B_0$ magnetic field is perpendicular to the RF magnetic field $B_2$ (in the area of the flat sample cavity). Typically, the EPR microwave resonator is operated with a microwave radiation having a microwave frequency of between 8 GHz and 90 GHz. Typically, the magnet arrangement is designed and configured for generating a $B_0$ magnetic field of 0.2-2 Tesla; accordingly, the DNP-NMR measuring device is a low field DNP-NMR measuring device then. A typical DNP-NMR measuring device is of benchtop size, having a good NMR signal intensity by means of the invention.

In an exemplary embodiment of the DNP-NMR measuring device, the EPR microwave resonator is dimensioned and configured for a particular microwave mode, wherein the sample cell is positioned such that:
- a $B_1$ microwave magnetic field of said particular microwave mode is oriented basically perpendicular to the $B_0$ magnetic field in the area of the flat sample cavity; and
- the sample cavity plane is oriented along a plane of minimum electric field of said particular microwave mode, wherein the plane of minimum electric field of said particular microwave mode runs through the flat sample cavity.

In this way the irradiation of the liquid sample in the flat sample cavity via the $B_1$ microwave magnetic field can be maximized. Typically, the angle between the $B_1$ microwave magnetic field and the $B_0$ magnetic field in the area of the flat sample cavity deviates at maximum by 10° from 90°. Said particular microwave mode exhibits a plane of minimum of the electric field, typically located between two neighbouring maxima of the electric field, and the sample cavity plane at least approximately coincides with said plane of minimum electric field. So, the electric field of said particular microwave mode has a minimum in the area of the flat sample cavity. In this way the absorption of microwave electrical energy by the liquid sample is minimized.

In a particular development of this embodiment, the $B_1$ microwave magnetic field of said particular microwave mode is oriented basically parallel to the sample cavity plane in the area of the flat sample cavity. Accordingly, in this further development, the $B_1$ magnetic field and RF magnetic field $B_2$ are basically perpendicular in the area of the flat sample cavity. This arrangement has been proven in practice. The exposure of the sample to the MW electric field is therefore minimized. Typically, the angle between the $B_1$ microwave magnetic field and sample cavity plane in the area of the flat sample cavity deviates at maximum by 10° from 0°. Correspondingly, the angle between the $B_1$ microwave magnetic field and the $B_2$ magnetic field in the area of the flat sample cavity deviates at maximum by 10° from 90°.

In an advantageous embodiment of the DNP-NMR measuring device, the EPR microwave resonator is dimensioned and configured for microwave mode $TE_{102}$. Such a microwave resonator has been proven in practice and can be used well with the NMR probe. In particular, the $TE_{102}$ mode has a central plane of minimum MW electric field at which the sample cell can be placed conveniently.

In another advantageous embodiment of the DNP-NMR measuring device, the DNP-NMR measuring device further comprises:
- a microwave source;
- a waveguide for guiding microwave radiation to the EPR microwave resonator; and
- an iris for coupling the microwave radiation from the waveguide into the EPR microwave resonator. With such a set-up the microwave radiation can easily be fed into the EPR microwave resonator. Such a set-up has been proven in practice. The different parts of the measuring device are commercially available and thereby are easily accessible.

The scope of the invention also includes the use of a sample cell as described above or an NMR probe as described above or a DNP measuring device as described above in a DNP-NMR measurement. The DNP-NMR measurements can achieve a high NMR signal strength. The EPR microwave resonator can reach high q factors with the sample cell or the NMR probe inserted. The liquid sample filled into the sample cell may be located practically completely in a region of high MW magnetic field and low MW electric field. In this way the excitation via the MW magnetic field is maximized while sample heating caused by the MW electric field is minimized. Further, the sample cell can be exchanged. Also, a high filling factor of the NMR coil wound around the flat sample cavity can be achieved, which leads to a large NMR signal. The microwave frequency of the microwave radiation is typically chosen such that for the microwave wavelength λ, the following applies: H≤λ/10. The orientation of the sample cell in the EPR microwave resonator is chosen such that in the area of the flat sample cavity, $B_0$ is (basically) perpendicular to $B_2$, and $B_0$ is (basically) perpendicular to $B_1$. Often further $B_2$ is (basically) perpendicular to $B_1$ in the area of the flat sample cavity.

Further advantages can be extracted from the description and the enclosed drawings. The features mentioned above and below can be used in accordance with the invention either individually or collectively in any combination. The embodiments mentioned are not to be understood as exhaustive enumeration but rather have exemplary character for the description of the invention.

DETAILED DESCRIPTION

Figure 1:
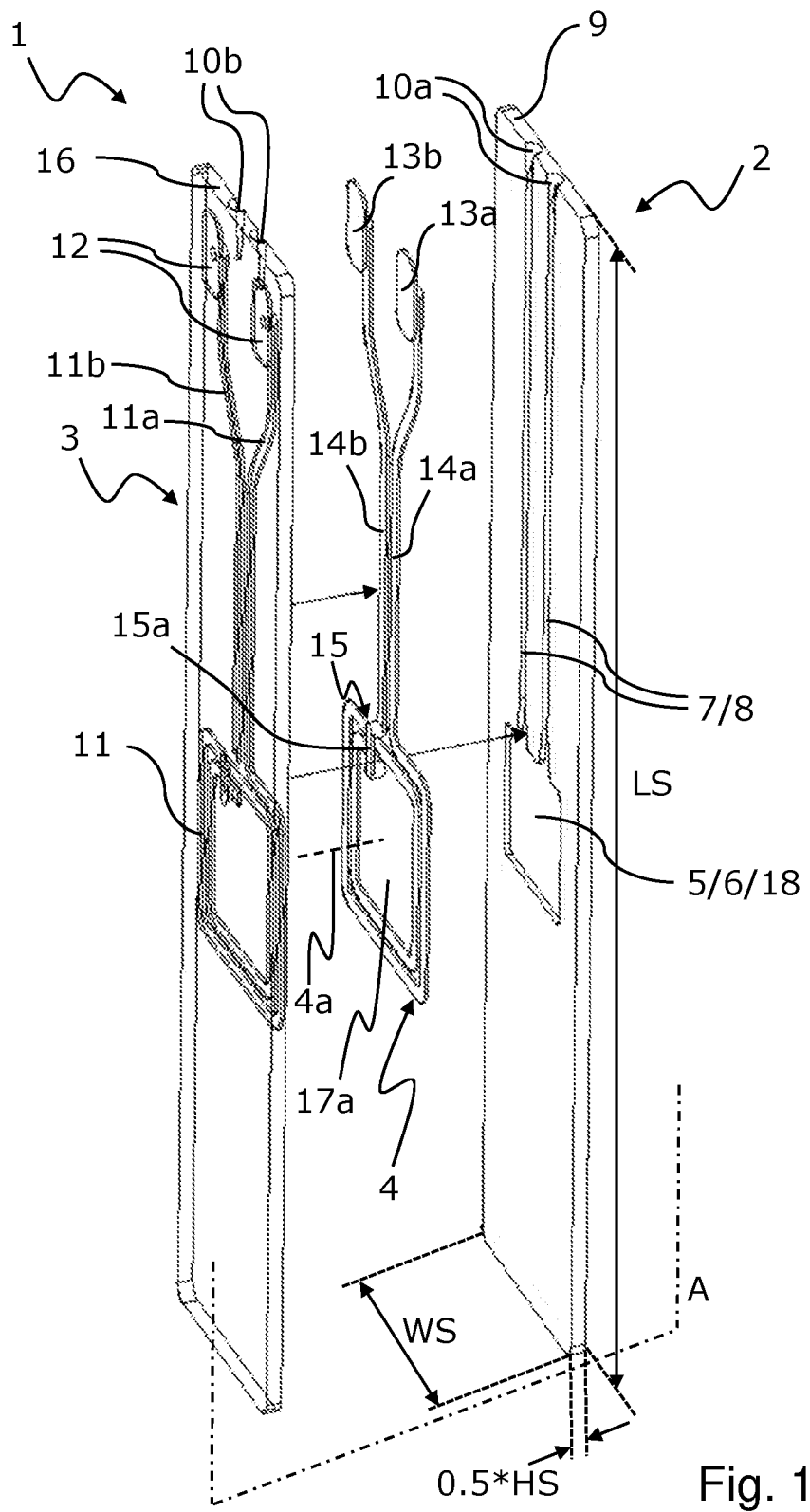
FIG. 1 shows an exploded view of an embodiment of a sample cell according to the invention, with two plates, a coil recess, a cavity recess and an NMR coil.

FIG. 1 shows an exploded view of a sample cell 1 according to the invention. The sample cell 1 comprises a first plate 2, a second plate 3 and an NMR coil 4. The plates 2, 3 are basically rectangular and elongated in a long direction (here the vertical direction). In the embodiment shown, each of the two plates 2, 3 have a (maximum) length LS of 50 mm, a (maximum) width WS of 10 mm and a (maximum) height HS of 1 mm; note that the example dimensions of LS, WS and HS are typical for a 10 GHz EPR microwave resonator.

A cavity recess 5 is etched into the first plate 2 which forms a flat sample cavity 6; the cavity recess 5 is etched into the first plate 2 from the inner flat side facing the second plate 3. The flat sample cavity 6 is approximately cuboidally shaped with curved edges. Furthermore, two channel recesses 7 are etched into the first plate 2 which form two channels 8. The two channels 8 are positioned parallel and next to each other here. In the embodiment shown, the two channels 8 are shaped approximately cuboidally with a length of 20 mm, a width of 0.2 mm and a height of 0.2 mm. At an upper end 9 of the first plate 2, the channels 8 open into connections (inlet/outlet) for a liquid sample to be measured; the connections are simply called inlets here. First halves of the inlets 10a for the two channels 8 are formed in the first plate 2, wherein the two first halves of the inlets 10a are shaped semi-conical here. The two channels 8 are connected to the flat sample cavity 6 whereby the two channels 8 widen at the transition into the flat sample cavity 6.

A coil recess 11 is etched into the second plate 3; the coil recess 11 is etched into the second plate 3 from the inner flat side facing the first plate 2. The coil recess 11 here also comprises two contact channels 11a, 11b for contact lines 14a, 14b to the NMR coil 4, wherein the contact lines 14a, 14b lead from contacts 13a, 13b to the NMR coil 4. The NMR coil 4 can be arranged in the coil recess 11 of the second plate 3. The NMR coil 4 is arranged on the side of the second plate 3 that faces the flat sample cavity 6 of the first plate 2. The contacts 13a, 13b for the NMR coil 4 are arranged on the outer side of the second plate 3 facing away from the first plate 2 and the sample cavity 6, in respective contact recesses 12 prepared on said outer side of the second plate 3. In the example shown, the NMR coil 4 comprises two conductor loops that are wound in a pancake type fashion. In an alternative embodiment the NMR coil 4 may e.g., comprise more than two conductor loops or only one conductor loop (not shown).

The NMR coil 4 is wound around a coil axis 4a. The coil axis 4a is centrally arranged inside the NMR coil 4 or its wound conductor loops. The NMR coil 4 is bridged in a bridging area 15 for contacting an inner end of the NMR coil 4, so that the NMR coil 4 or its wound conductor loops can be basically flat. Typically, the NMR coil 4 is arranged in the coil recess 11 of the second plate 3 via sputtering (i.e., the NMR coil 4 is built up directly inside the coil recess 11); the same applies to the contact lines 14a, 14b in the contact channels 11a, 11b.

On an upper end 16 of the second plate 3 two second halves of inlets 10b are formed. The two second halves of inlets 10b are shaped semi-conical and form the counterpart to the two first halves of inlets 10a of the first plate 2. In an assembled form of the sample cell 1 the two semi-conical halves of inlets 10a and the two semi-conical halves of inlets 10b form two conical inlets or connections for inserting and/or removing a liquid sample.

When the two plates 2, 3 are joined to each other the cavity recess 5 that forms the flat sample cavity 6 is enclosed between and sealed by the two plates 2, 3. Only then it will be possible to fill a liquid sample via the channels 8 into the sample cell 1. The conical form of the inlets or connections formed by the semi-conical halves of inlets 10a, 10b simplifies filling the liquid sample into the sample cell 1 or removing the liquid sample from the sample cell 1. The small size of the channels 8 prevents impurities like dust from easily entering the flat sample cavity 6; in addition it minimizes a signal contribution from liquid sample that is not located inside the desired sample volume, i.e. in the flat sample cavity 6 (where the RF magnetic field is maximum and homogeneous). Furthermore, the small size of the channels 8 also prevents fast evaporation of the solvent of the liquid sample filled into the sample cell 1.

Further, in the joined form the NMR coil 4 is enclosed between the two plates 2, 3. Note that for electrical contacting, the (external) contacts 13 of the NMR coil 4 and a bridging contact 15a in the bridging area 15 for connecting the inner end of the NMR coil 4 with the contact line 14b and the contact 13b are arranged on the outer side of second plate 2 (i.e. on the side facing away from the first plate 2) here. The NMR coil 4, in particular its wound conductor loops, as well as the contact lines 14a, 14b are well protected from the environment. Thereby, the risk of damaging the NMR coil 4 or the contact lines 14a, 14b during sample preparation or during insertion of the sample cell 1 into a measurement device, and in particular into an NMR probe or a sample cell holder, is minimized.

An NMR coil cross-sectional area 17a, taken perpendicular to the NMR coil axis 4a, is confined by the NMR coil 4. Here, in the joined form of the sample cell 1, about 90% of the NMR coil cross-sectional area 17a is taken up by (or overlaps with) a sample cavity cross-sectional area 18 of the flat sample cavity 6, taken also perpendicular to the NMR coil axis 4a. Thereby, a high filling factor of the NMR coil 4 is achieved. Due to the high filling factor of the NMR coil 4 a high strength NMR signal can be achieved. In use, the NMR coil 4 that is wound around the flat sample cavity 6 generates an RF magnetic field $B_2$, with the RF magnetic field $B_2$ basically parallel to the NMR coil axis 4a in an area of the flat sample cavity 6 (see FIG. 7 below).

The recesses 5, 7, 11, 12 are made by etching. As etching method laser-assisted micromachining is preferably used because this method offers various possibilities of creating different 3D structures. Alternatively other etching methods like ion beam etching or dry etching may be used. As a material for the two plates 2, 3 fused silica is preferably used. Alternatively, it is also possible to use borosilicate. Both fused silica and borosilicate are possible wafer materials for laser-assisted micromachining. Note that the invention is not restricted with respect to possible manufacturing methods of the sample cell 1; in particular, it may be possible to use 3D printing for preparing a sample cell 1 or its plates 2, 3.

In alternative embodiments, the cavity recess 5 can be formed in two parts, with a part in the first plate 2 and a part in the second plate 3, or the cavity recess 5 can be formed only in the second plate 3 (not shown). Further the coil recess 11 can be formed in two parts, with a part in the second plate 3 and a part in the first plate 2, or the coil recess 11 can be formed only in the first plate 2 (not shown).

Figure 2:
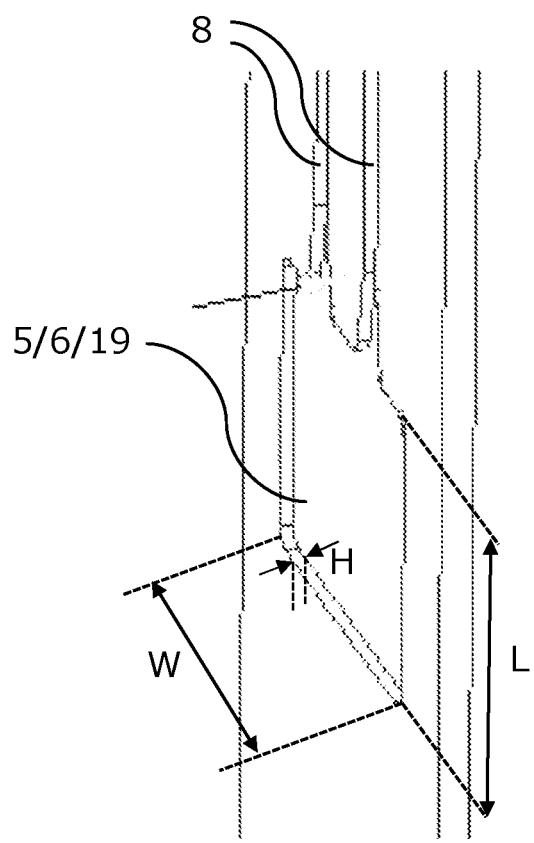
FIG. 2 shows an enlarged view of the first plate of FIG. 1 in the area of the cavity recess.

FIG. 2 depicts an enlarged view of the cavity recess 5 of the first plate 2 from the embodiment according to the invention of FIG. 1. The cavity recess 5 forms the flat sample cavity 6. The flat sample cavity 6 is connected to the two channels 8.

Here the flat sample cavity 6 is formed approximately cuboidally with curved edges. In the embodiment shown, the flat sample cavity 6 has a maximum length L of 5 mm, a maximum width W of 5 mm and a maximum height H of 0.2 mm. The volume of the flat sample cavity 6 taking into account the curved edges results in an effective sample volume of 4.8 μl here.

The flat sample cavity 6 basically extends along a sample cavity plane 19; the directions in which the maximum length L and the maximum width W extend are in parallel with the sample cavity plane 19, and the direction in which the maximum height H extends is perpendicular to the sample cavity plane 19. The sample cavity plane 19 is centred in the flat sample cavity 6 (see also FIG. 3).

Basically, with such a geometry of the flat sample cavity 6 and the sample cell 1, during a DNP-NMR measurement the flat sample cavity 6 can easily be positioned at and oriented parallel to a plane of zero electric field of the microwave radiation to avoid or at least minimize sample heating. At the same time the dimensions allow for an increased volume of the flat sample cavity 6.

Figure 3:
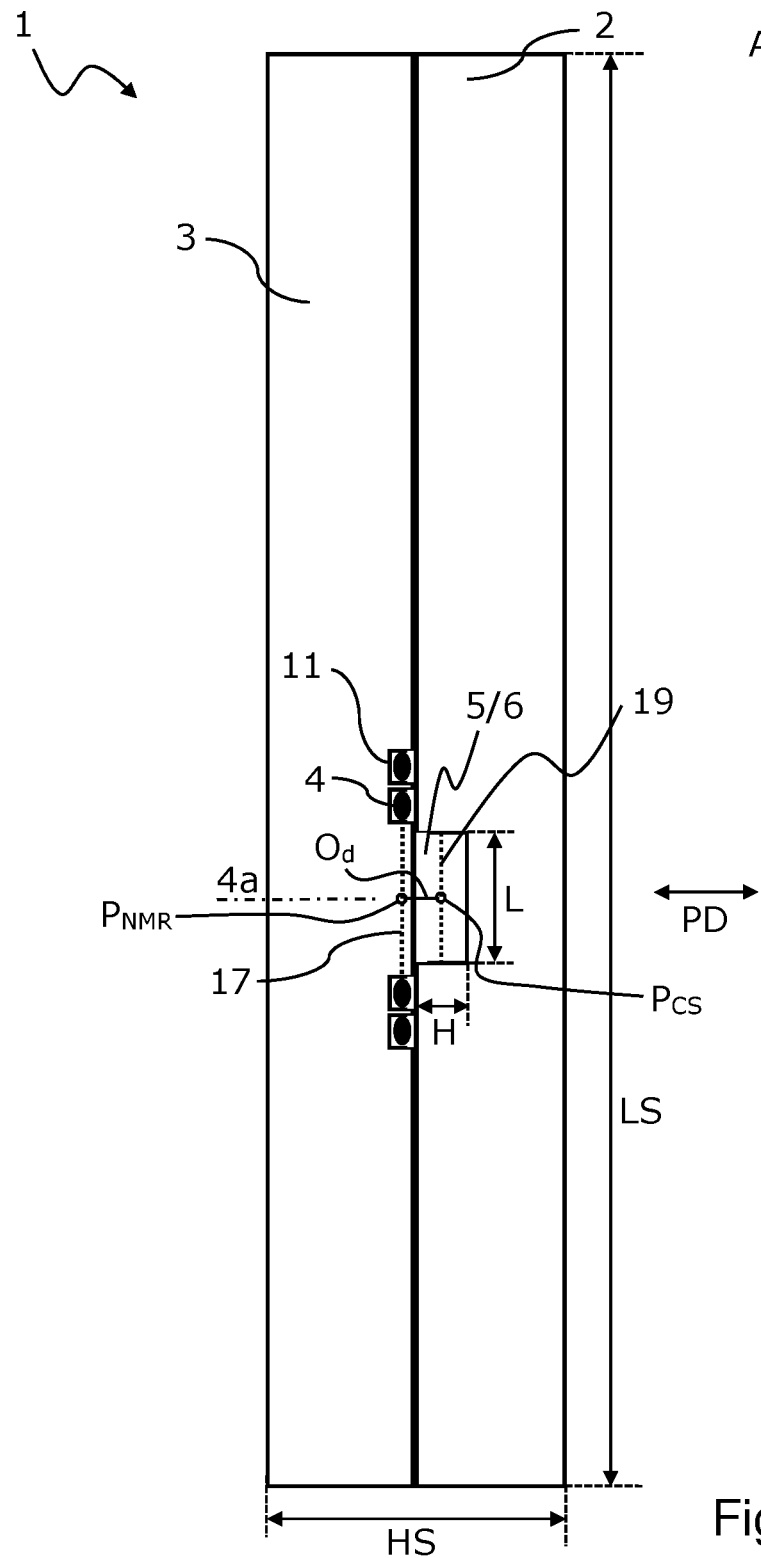
FIG. 3 shows a schematic longitudinal section of the sample cell from FIG. 1 in assembled form in the plane A there.

In FIG. 3 a schematic longitudinal section of the sample cell 1 of FIG. 1 according to the invention in assembled form in the plane A there is shown. The sample cell 1 comprises the first plate 2 with the cavity recess 5 and the flat sample cavity 6, and the second plate 3 with the coil recess 11 and the NMR coil 4.

In FIG. 3, the dimensions LS and HS of the sample cell 1 and L and H of the flat sample cavity 6 are indicated again; note that for the purpose of better visibility the proportions of L to H and LS to HS are not to scale here.

In the first plate 2 the sample cavity plane 19 of the flat sample cavity 6 is shown as a dashed line. The sample cavity plane 19 is centrally arranged inside the flat sample cavity 6 with respect to a direction PD perpendicular to the sample cavity plane 19. As the height H of the flat sample cavity 6 is 0.2 mm this means that the sample cavity plane 19 is located at 0.1 mm in direction of H inside the flat sample cavity 6.

Arranged in the second plate 3, the NMR coil 4 comprises two conductor loops arranged in the coil recess 11; note that the coil recess 11 is wound in accordance with the course of the NMR coil 4, and accordingly has two loops, too. For simplicity, the NMR coil 4 is drawn with oval cross-section of the corresponding conductor. In the example shown, the NMR coil 4 (with its wound conductor loops) is arranged basically along an NMR coil plane 17. The NMR coil plane 17 is parallel to the sample cavity plane 19, and is located centrally with respect to the NMR coil along the NMR coil axis 4a.

The flat sample cavity 6 comprises a centre Point $P_{CS}$. The centre point $P_{CS}$ is located in the centre of the sample cavity plane 19. Furthermore, the NMR coil 4 comprises a centre Point $P_{NMR}$. The centre point $P_{NMR}$ is located in the centre of the NMR coil plane 17. An offset distance $O_d$ between the centre Point $P_{CS}$ and the centre point $P_{NMR}$ is about 0.12 mm here. Generally, the q factor of an ESR resonator using a sample cell as shown used during a DNP-NMR measurement may reach particularly high values when the offset distance $O_d$ is small. When a large q factor is achieved a better quality of the DNP-NMR measurements is achieved.

Figure 4:
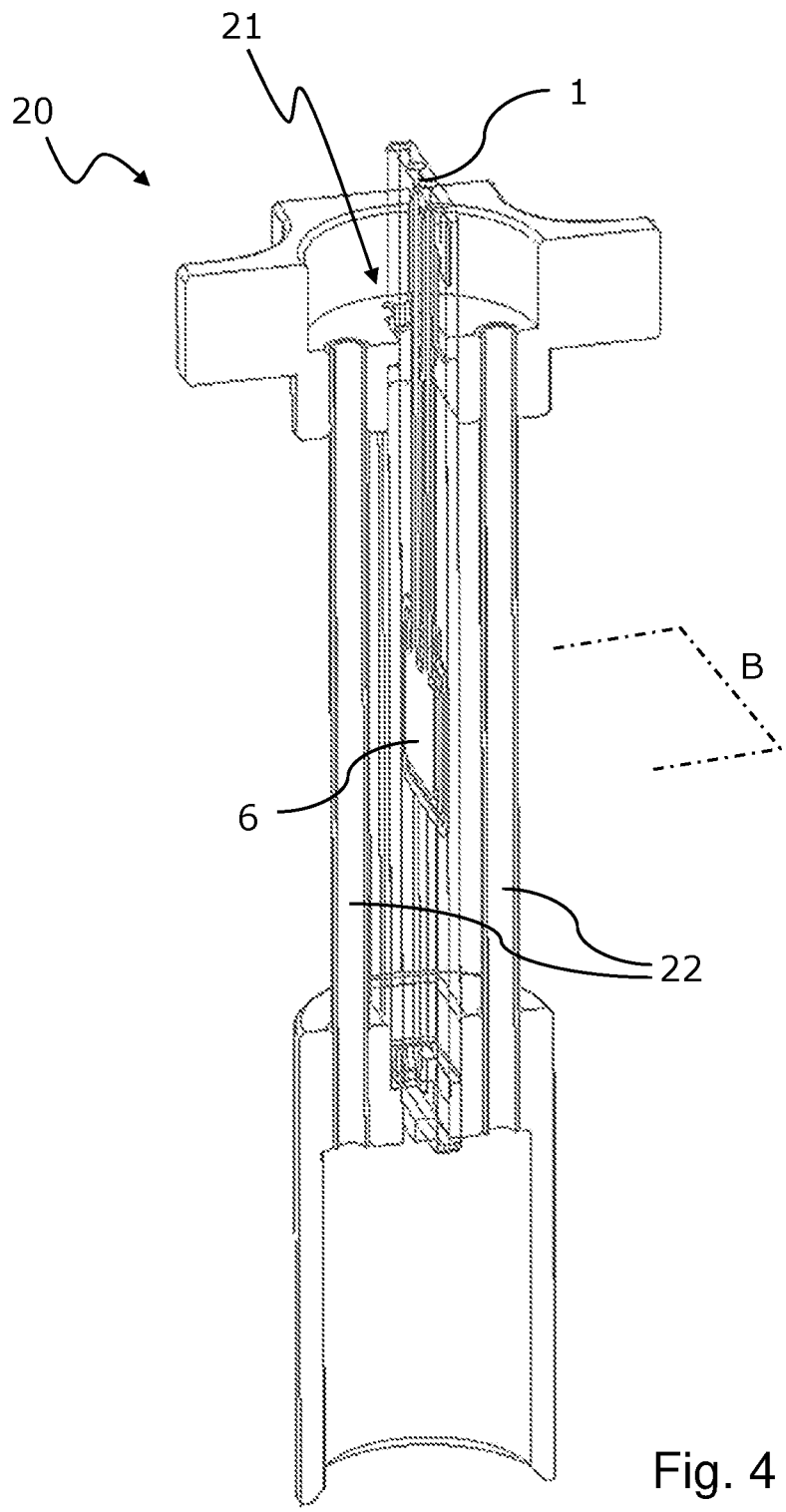
FIG. 4 shows a schematic, partially sectional drawing of an embodiment of an NMR probe according to the invention, with the sample cell of FIG. 1 inserted in a sample cell holder and two sweeping coils.

FIG. 4 shows a schematic drawing of an NMR probe 20 according to the invention, in a view basically with the NMR probe 20 cut in half. The sample cell 1 is shown as whole.

The NMR probe 20 comprises a sample cell holder 21 for inserting and removing the sample cell 1. Here, the sample cell 1 is shown in an inserted state in the sample cell holder 21.

The NMR probe 20 further comprises two sweeping coils 22. The sweeping coils 22 are arranged on both of the (flat) sides of the sample cell 1. The sweeping coils 22 run parallel to each other. Further, the sweeping coils 22 run parallel to the sample cavity plane of the flat sample cavity 6. In use the sweeping coils 22 generate a sweeping magnetic field. The sweeping magnetic field is parallel to the sample cavity plane in the area of the flat sample cavity 6 (see also FIG. 7).

Figure 5:
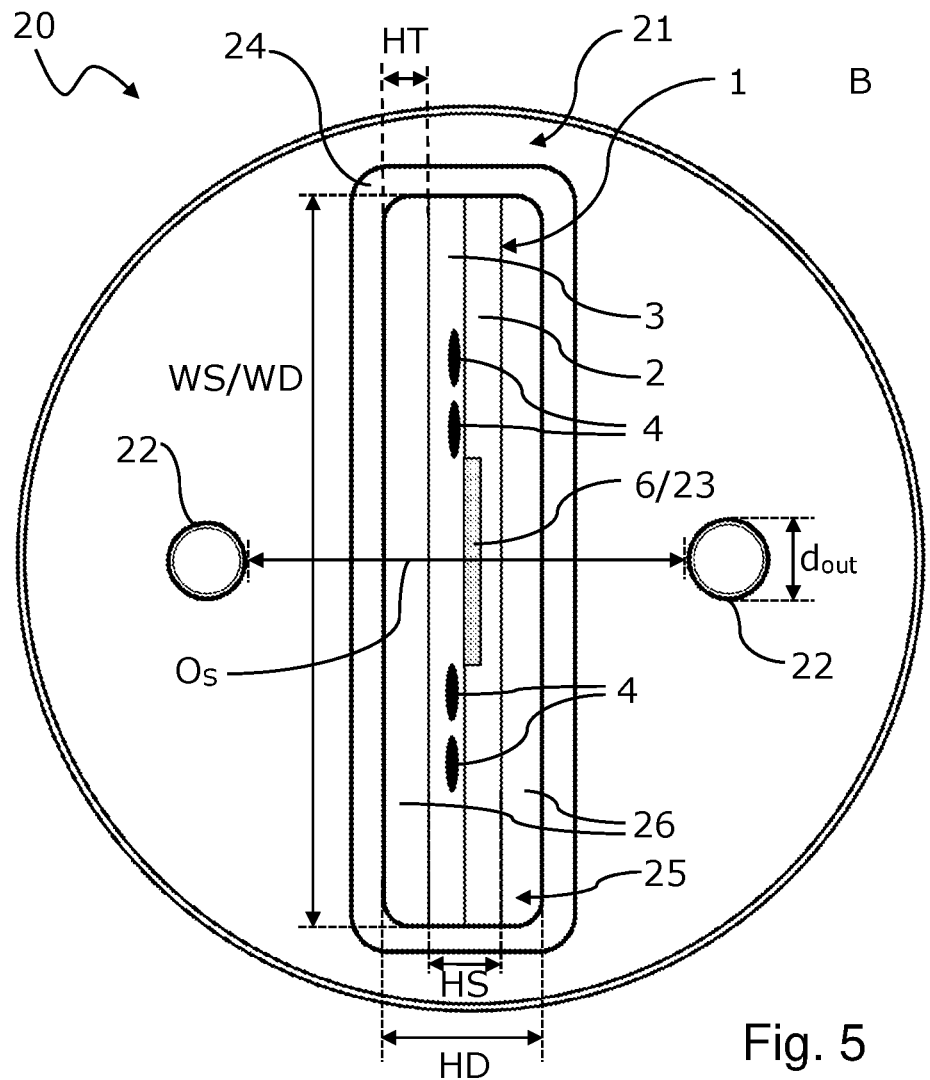
FIG. 5 shows a schematic cross-section of the NMR probe from FIG. 4 in the plane B there.

In FIG. 5 a schematic cross-section of the NMR probe 20 according to the invention from FIG. 4 in the plane B there is shown. The NMR probe 20 comprises the sample cell 1, the sample cell holder 21 and the two sweeping coils 22. The sample cell 1 is shown schematically with the first plate 2 comprising the flat sample cavity 6 filled with a liquid sample 23 (dotted area) and the second plate 3 comprising the coil recess (not shown here for simplification) containing the NMR coil 4.

Here the sample cell holder 21 is formed with a dielectric sleeve 24. The dielectric sleeve 24 has an inner height HD of here 2 mm and an inner width WD of here 10 mm. An inner region 25 of the dielectric sleeve 24 extends with the inner height HD and the inner width WD and is shaped basically rectangular in cross-section with rounded corners. The maximum height HS of the sample cell 1 is 1 mm and the maximum width WS of the sample cell 1 is 10 mm in the example presented (see FIG. 1), which just fits into the dielectric sleeve 24.

With the sample cell 1 centrally inserted into the dielectric sleeve 24, two tempering channels 26 are formed. The two tempering channels 26 are limited by the sample cell 1 and the dielectric sleeve 24 in cross-section. Each of the channels 26 has a height HT of here 0.5 mm. The two tempering channels 26 extend parallel to the flat sample cavity 6 and adjacent to the sample cell 1.

The tempering channels 26 are used to vary and or to keep the temperature of the liquid sample 23 to be measured. In use, the temperature of the tempering channel 26 is controlled via a tempering fluid flow (for example a gas stream or a liquid). A temperature control system (not shown) may be used for controlling the temperature of the liquid sample 23 or the tempering fluid flow, respectively. When DNP-NMR measurements are performed the temperature of the liquid sample 23 to be measured is stabilized by the tempering fluid flow during microwave irradiation. Thereby, it is possible to produce comparable and reproducible results.

Alternatively, the sample cell holder 21 can be formed such that the sample cell 1 and the dielectric sleeve 24 form only one tempering channel 26 (not shown). Then preferably, the tempering channel 26 extends parallel to the flat sample cavity 6 on the side of the sample cell 1 closest to the flat sample cavity 6 (not shown) to ensure a good temperature control.

In the embodiment shown, the two sweeping coils 22 are rod-shaped with a circular cross-section. The sweeping coils 22 are of tube type. Coil wires (not shown) are included inside the sweeping coils 22. The sweeping coils 22 run parallel to the sample cavity plane and parallel to each other. Here, an offset $O_S$ of the sweeping coils 22 is 6.5 mm and a maximum outer diameter $d_{out}$ of the sweeping coils 22 is 1 mm. In use, with such an outer diameter $d_{out}$ a relatively high q factor can be achieved, as compared to larger outer diameters $d_{out}$.

Figure 6:
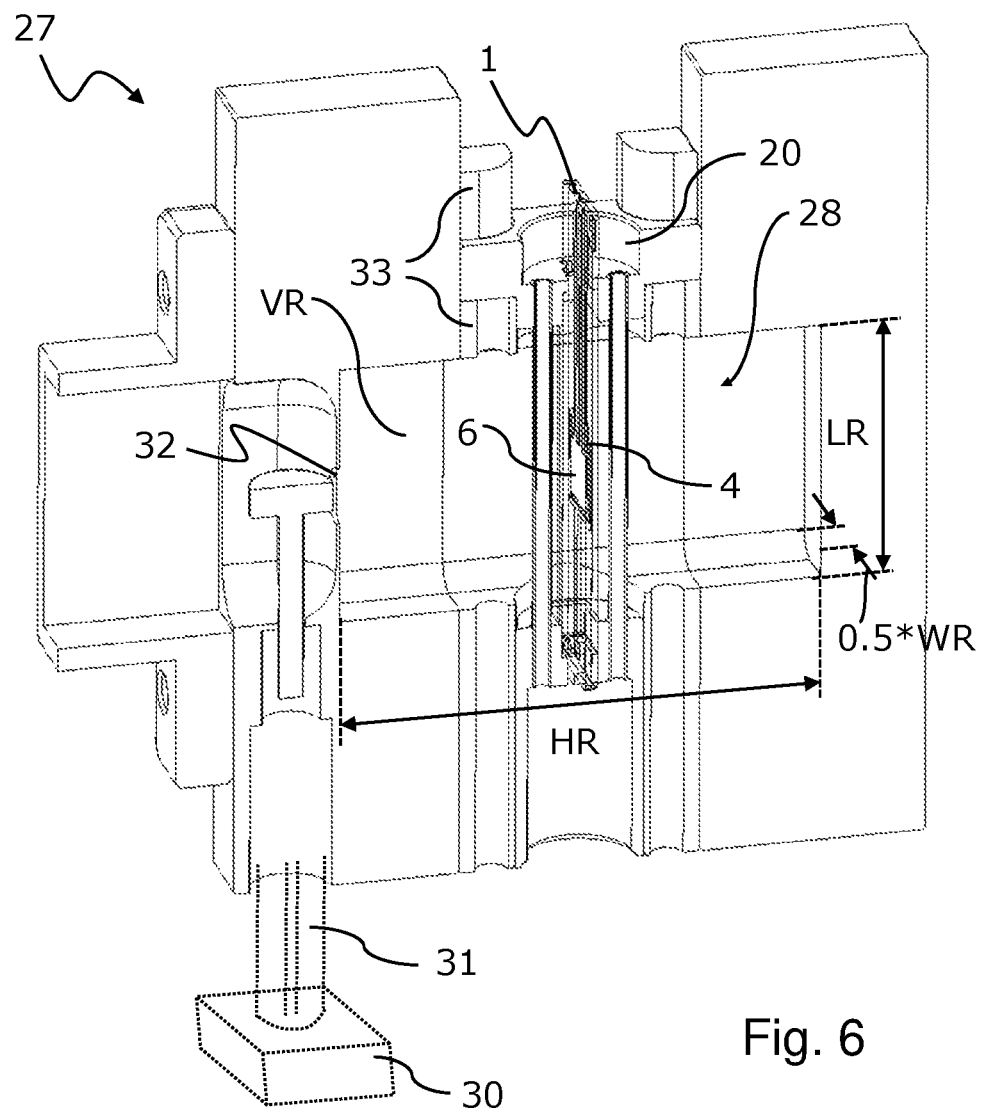
FIG. 6 shows a schematic, partially sectional drawing of an embodiment of an DNP-NMR measuring device according to the invention, with an EPR microwave resonator and the NMR probe of FIG. 4 inserted.

FIG. 6 depicts a schematic drawing of a DNP-NMR measuring device 27 (cut in half) according to the invention with an EPR microwave resonator 28 (cut in half) and the NMR probe 20 (cut in half) with the sample cell 1 inserted (and shown as whole and half transparent).

Figure 7:
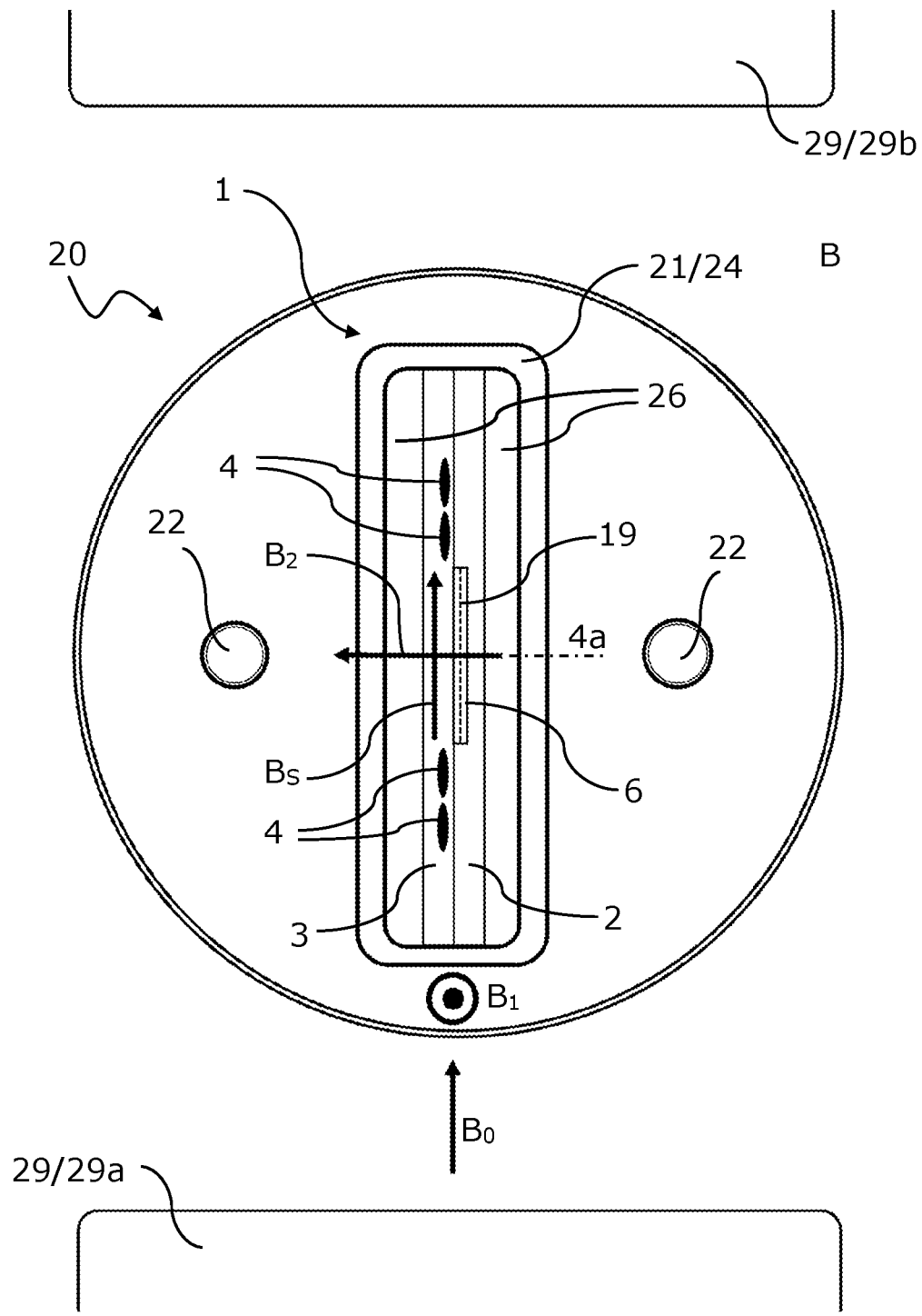
FIG. 7 shows a simplified schematic cross-section of the NMR probe from FIG. 4 in the plane B there, with the directions and approximate positions of the different magnetic fields that are used during DNP-NMR measurements.

The DNP-NMR measuring device 27 further comprises a magnet arrangement (not shown, but compare FIG. 7). In use, the magnet arrangement generates a $B_0$ magnetic field (see FIG. 7). The DNP-NMR measuring device 27 also comprises a microwave source 30 for generating microwave radiation and a waveguide 31 that guides the microwave radiation generated at the microwave source 30 to the EPR microwave resonator 28. Therefore, the microwave radiation is guided to an iris 32 and coupled into the EPR microwave resonator 28.

A resonant volume VR of the EPR microwave resonator 28 encloses a cubic volume here with a length LR of 22.7 mm, a width WR of 11.5 mm and a height HR of 41.2 mm (note that the nomenclature here sticks to the allocation of letters L, W and H as for the flat sample cavity 6, and R indicates the resonator). In use, the EPR microwave resonator 28 is operated in $TE_{102}$ mode with a microwave radiation having a resonance frequency of about 10 GHz here. A $B_1$ microwave magnetic field of the $TE_{102}$ mode is oriented perpendicular to the $B_0$ magnetic field in the area of the flat sample cavity 6 (see FIG. 7).

The NMR probe 20 is inserted into the EPR microwave resonator 28 and fastened with clamping elements 33. About half of the NMR probe 20 is located inside the EPR microwave resonator 28. The flat sample cavity 6 and the NMR coil 4 of the inserted sample cell 1 are positioned centrally (and completely) in the EPR microwave resonator 28. There the microwave magnetic field $B_1$ peaks and the microwave electric field vanishes (i.e., is minimal) in the area of the flat sample cavity 6.

The strength of the $B_0$ magnetic field generated by the magnet arrangement is here about 0.4 Tesla; note that a typical range for $B_0$ values is 0.2 to 2 Tesla. So the DNP-NMR measuring device 27 is a low field DNP-NMR measuring device 27. The DNP-NMR measuring device 27 is of benchtop size.

FIG. 7 shows a simplified schematic cross-section of the NMR probe 20 from FIG. 4 in the plane B there with the directions and approximate positions, where applicable, of the different magnetic fields that are used, in particular generated and/or measured, during DNP-NMR measurements with the NMR probe 20 inserted into the EPR microwave resonator depicted in FIG. 6.

The NMR probe 20 comprises the sweeping coils 22, the sample cell holder 21 formed with a dielectric sleeve 24, the two tempering channels 26 and the sample cell 1. The sample cell 1 comprises the first plate 2 with the cavity recess for the flat sample cavity 6 and the second plate 3 with the coil recess for the NMR coil 4.

During DNP-NMR measurements four different magnetic fields are of relevance:

The $B_0$ magnetic field is generated by the magnet arrangement 29 of the DNP-NMR measuring device. In the chosen embodiment, the magnet arrangement 29 comprises a permanent magnet and a ferromagnetic yoke encompassing the permanent magnet, with two pole shoes 29a, 29b attached to the yoke. In a gap between the pole shoes 29a, 29b, the sample cell 1 is located and exposed to the static $B_0$ magnetic field established between the pole shoes 29a, 29b. In FIG. 7, only the two pole shoes 29a, 29b are partially shown. The $B_0$ magnetic field is oriented parallel to the sample cavity plane 19 in the area of the flat sample cavity 6. The static $B_0$ magnetic field (together with the sweeping magnetic field $B_S$, if applicable) is used to split the degenerate energy states of the nuclear spins of the sample to be measured, and to split degenerate energy states of spins of paramagnetic electrons in the sample to be measured.

The sweeping magnetic field $B_S$ is generated by the sweeping coils 22 and is parallel to the $B_0$ magnetic field in the area of the flat sample cavity 6, in particular in order to adjust the energy split of the paramagnetic electrons to the microwave frequency. The sweeping magnetic field $B_S$ is parallel to the sample cavity plane 19 in the area of the flat sample cavity 6.

The $B_1$ microwave magnetic field of $TE_{102}$ mode is generated by the microwave source. Inside the ESR resonator, a standing wave of microwave radiation is established, in accordance with said mode. The $B_1$ microwave magnetic field has a maximum in the area of the flat sample cavity 6, and is oriented parallel to the sample cavity plane 19 in the area of the flat sample cavity 6. Due to the geometry of the flat sample cavity 6, in particular its small height H (see FIG. 2 or 3), the sample to be measured is excited homogeneously by the $B_1$ microwave magnetic field. At the same time a plane of minimum electric field of $TE_{102}$ mode runs through the flat sample cavity 6. Due to the small height H of the flat sample cavity 6 the absorption of microwave electrical energy is low and thereby unwanted heating of the sample to be measured is low, too. The $B_1$ microwave magnetic field (which is in FIG. 7 perpendicular to the drawing plane) is oriented parallel to the sample cavity plane 19 in the area of the flat sample cavity 6 and perpendicular to the $B_0$ magnetic field and the sweeping magnetic field $B_S$ in the area of the flat sample cavity 6.

The RF magnetic field $B_2$ is generated and/or measured by the NMR coil 4. The $B_2$ magnetic field is parallel to the NMR coil axis 4a, and further the $B_2$ magnetic field is perpendicular to the flat sample cavity 6 or its sample cavity plane 19, respectively, in the area of the sample cavity 6. Furthermore, the $B_2$ magnetic field is oriented perpendicular to the $B_0$ magnetic field and the sweeping magnetic field $B_S$. Finally, the $B_2$ magnetic field is perpendicular to the $B_1$ microwave magnetic field in the area of the flat sample cavity 6; in other words, the NMR coil plane is parallel to the $B_1$ magnetic field, what minimizes interferences of the $B_1$ magnetic field and the $B_2$ magnetic field (or the NMR coil 4, respectively). The $B_2$ magnetic field excites and detects the nuclear spin transitions in the sample to be measured.

The invention claimed is:

1. A sample cell for performing DNP-NMR measurements, for interchangeable use in an EPR microwave resonator, the sample cell comprising:
   a first plate and a second plate that are joined to each other to enclose a flat sample cavity for holding a liquid sample to be measured, the flat sample cavity being formed by a cavity recess in the first plate and/or a cavity recess in the second plate, wherein the flat sample cavity extends with a maximum length L and a maximum width W in a sample cavity plane, and extends with a maximum height H perpendicular to the sample cavity plane, with $H \leq \frac{1}{15}*L$ and $H \leq \frac{1}{15}*W$, and an NMR coil wound around the flat sample cavity for generating an RF magnetic field B2, wherein a coil axis of the NMR coil about which the NMR coil is wound is oriented perpendicular to the sample cavity plane.

2. The sample cell according to claim 1, wherein a coil recess is formed in the first plate and/or a coil recess is formed in the second plate, wherein the NMR coil is arranged in the coil recess of the first plate and/or the coil recess of the second plate.

3. The sample cell according to claim 2 wherein the NMR coil is enclosed between the first plate and the second plate.

4. The sample cell according to claim 2, wherein the flat sample cavity is formed only by the cavity recess of the first plate, and only the second plate forms the coil recess, in which the NMR coil is arranged.

5. The sample cell according to claim 1, wherein for an offset distance $O_d$ between a centre point $P_{NMR}$ of the NMR coil and a centre point $P_{CS}$ of the flat sample cavity, taken along the direction perpendicular of the sample cavity plane, $O_d \leq 0.5$ mm.

6. The sample cell according to claim 1, wherein the maximum length L of the flat sample cavity is 3 mm$\leq$L$\leq$7 mm, the maximum width W of the flat sample cavity is 3 mm$\leq$W$\leq$7 mm, and the maximum height H of the flat sample cavity is 0.12 mm$\leq$H$\leq$0.36 mm.

7. An NMR probe for performing DNP-NMR measurements, for use in an EPR microwave resonator, the NMR probe comprising:
a sample cell according to claim 1,
a sample cell holder for reversible insertion of the sample cell, wherein the sample cell is inserted into the sample cell holder, and
two sweeping coils for generating a sweeping magnetic field which is substantially parallel to the sample cavity plane in the area of the flat sample cavity of the inserted sample cell.

8. The NMR probe according to claim 7 wherein, with the sample cell inserted into the sample cell holder, the NMR probe forms at least one tempering channel for varying and/or keeping a temperature of the liquid sample to be measured.

9. The NMR probe according to claim 8 wherein, at least in a region of the flat sample cavity, the at least one tempering channel extends parallel to the flat sample cavity and adjacent to the sample cell.

10. The NMR probe according to claim 9, wherein the NMR probe comprises a dielectric sleeve that at least partially limits the at least one tempering channel.

11. The NMR probe according to claim 10 wherein an inner region of the dielectric sleeve is subdivided into two tempering channels with the sample cell inserted in the sample cell holder.

12. The NMR probe according to claim 7, wherein the two sweeping coils are rod-shaped.

13. The NMR probe according to claim 7, wherein the two sweeping coils run parallel to each other.

14. The NMR probe according to claim 7 wherein the two sweeping coils run parallel to the sample cavity plane.

15. A DNP-NMR measuring device comprising
an EPR microwave resonator,
an NMR probe according to claim 7, wherein the NMR probe is positioned at least partially inside the EPR microwave resonator such that the flat sample cavity and the NMR coil of the sample cell inserted into the sample cell holder are positioned inside the EPR microwave resonator, and
a magnet arrangement for generating a B0 magnetic field which is parallel to the sweeping magnetic field and parallel to the sample cavity plane in the area of the flat sample cavity of the inserted sample cell.

16. The DNP-NMR measuring device according to claim 15, wherein the EPR microwave resonator is dimensioned and configured for a particular microwave mode, and wherein the sample cell is positioned such that
a B1 microwave magnetic field of said particular microwave mode is oriented substantially perpendicularly to the B0 magnetic field in the area of the flat sample cavity, and
the sample cavity plane is oriented along a plane of minimum electric field of said particular microwave mode, wherein the plane of minimum electric field of said particular microwave mode runs through the flat sample cavity.

17. The DNP-NMR measuring device according to claim 16, wherein the B1 microwave magnetic field of said particular microwave mode is oriented substantially parallel to the sample cavity plane in the area of the flat sample cavity.

18. The DNP-NMR measuring device according to claim 15, wherein the EPR microwave resonator is dimensioned and configured for microwave mode TE102.

19. The DNP-NMR measuring device according to claim 15, further comprising:
a microwave source,
a waveguide for guiding microwave radiation to the EPR microwave resonator, and
an iris for coupling the microwave radiation from the waveguide into the EPR microwave resonator.

* * * * *